（12) United States Patent
Nikoonahad et al.

(10) Patent No.: US 6,753,528 B1
(45) Date of Patent: Jun. 22, 2004

(54) SYSTEM FOR MEMS INSPECTION AND CHARACTERIZATION

(75) Inventors: Mehrdad Nikoonahad, Menlo Park, CA (US); Guoheng Zhao, Milpitas, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 109 days.

(21) Appl. No.: 10/125,820

(22) Filed: Apr. 18, 2002

(51) Int. Cl.[7] .................. G01N 21/17; G01B 11/00
(52) U.S. Cl. .................. 250/341.1; 250/341.4; 250/341.8
(58) Field of Search .................. 250/341.1, 339.11, 250/341.4, 341.8

(56) References Cited

U.S. PATENT DOCUMENTS

| | | | | |
|---|---|---|---|---|
| 6,317,506 B1 | * | 11/2001 | Helbig et al. | 382/107 |
| 6,335,824 B1 | * | 1/2002 | Overbeck | 359/368 |
| 6,341,259 B1 | * | 1/2002 | Gutierrez et al. | 702/117 |
| 6,446,486 B1 | * | 9/2002 | deBoer et al. | 73/9 |
| 6,456,939 B1 | * | 9/2002 | McCall et al. | 701/220 |
| 6,542,829 B1 | * | 4/2003 | Gupta | 702/33 |
| 6,548,796 B1 | * | 4/2003 | Silvermintz et al. | 250/201.3 |
| 6,567,715 B1 | * | 5/2003 | Sinclair et al. | 700/110 |
| 6,587,212 B1 | * | 7/2003 | Barber et al. | 356/502 |
| 2002/0044278 A1 | * | 4/2002 | Le | 356/237.3 |
| 2003/0025918 A1 | * | 2/2003 | Watkins et al. | 356/609 |

* cited by examiner

Primary Examiner—Albert Gagliardi
(74) Attorney, Agent, or Firm—Parsons Hsue & de Runtz LLP

(57) ABSTRACT

A surface of the component in MEMS is illuminated by an illumination beam and the reflected beam is collected and detected by a position sensitive detector or photo detector array. As the surface is tilted about a pivot or about X and Y axes, the change in position of the collected beam is detected for characterizing the mechanical and optical properties of MEMS.

54 Claims, 7 Drawing Sheets

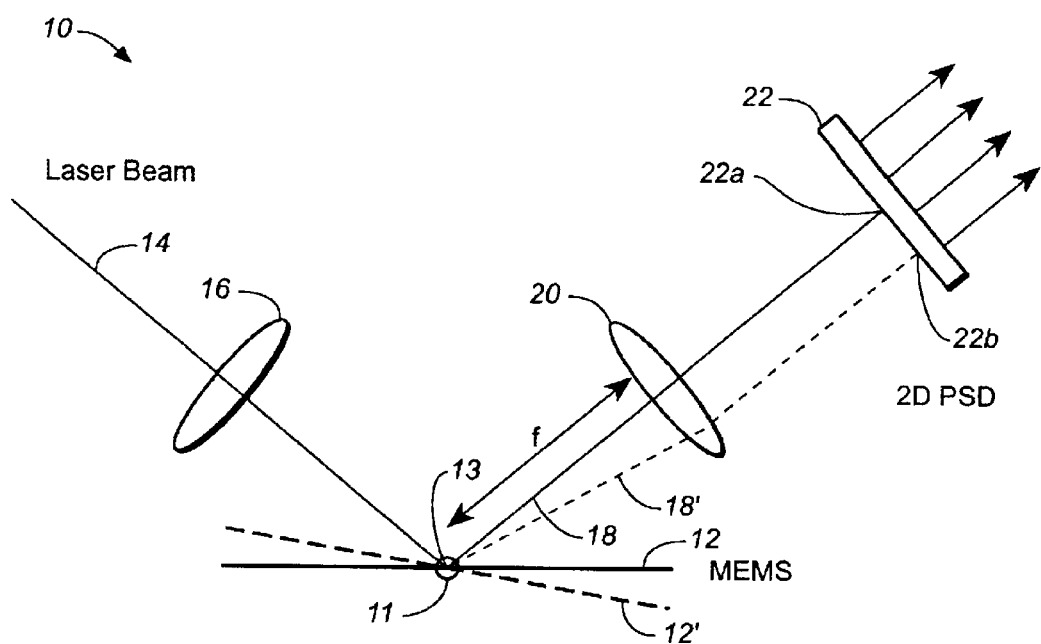
FIG._1

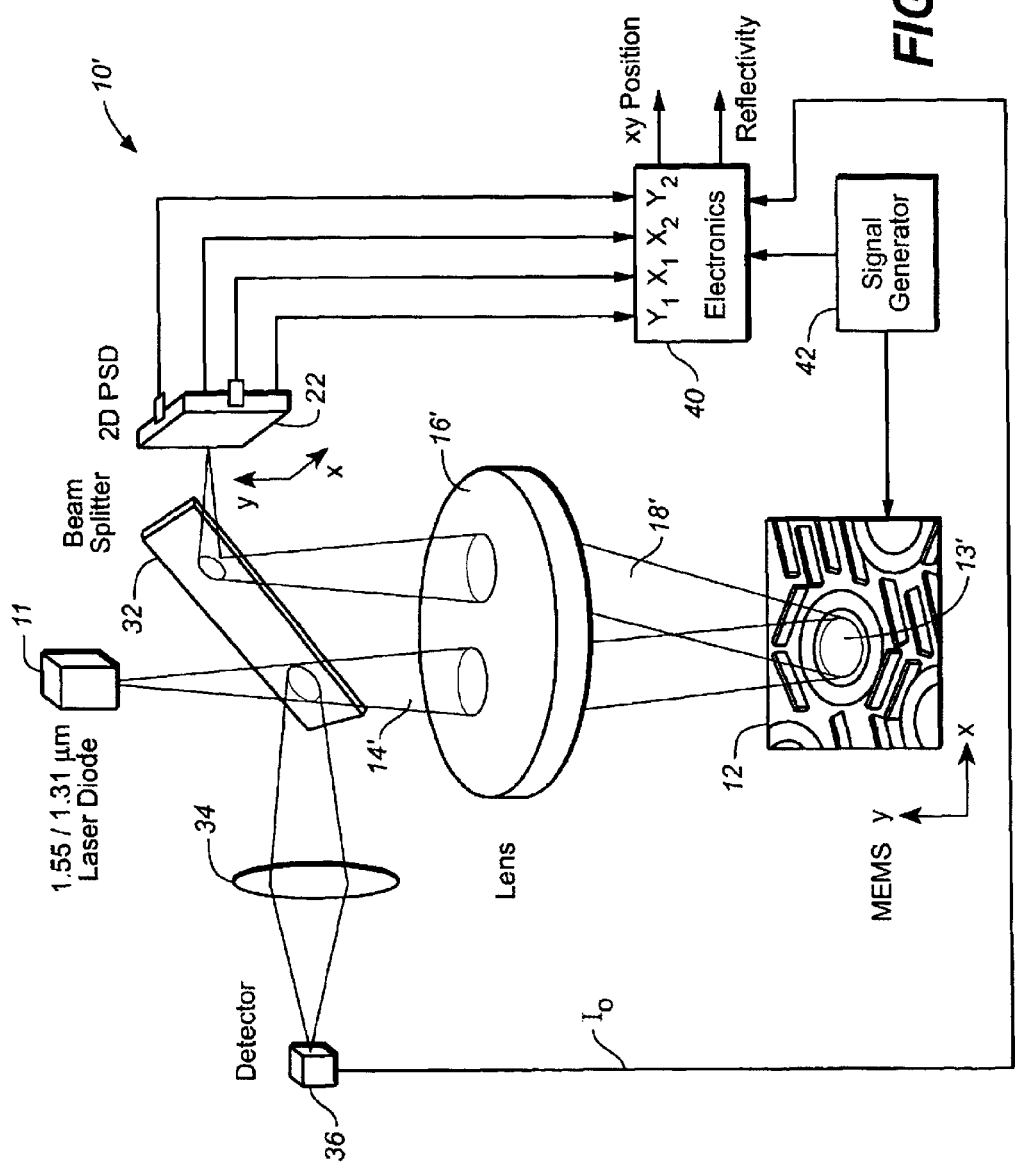
FIG._2

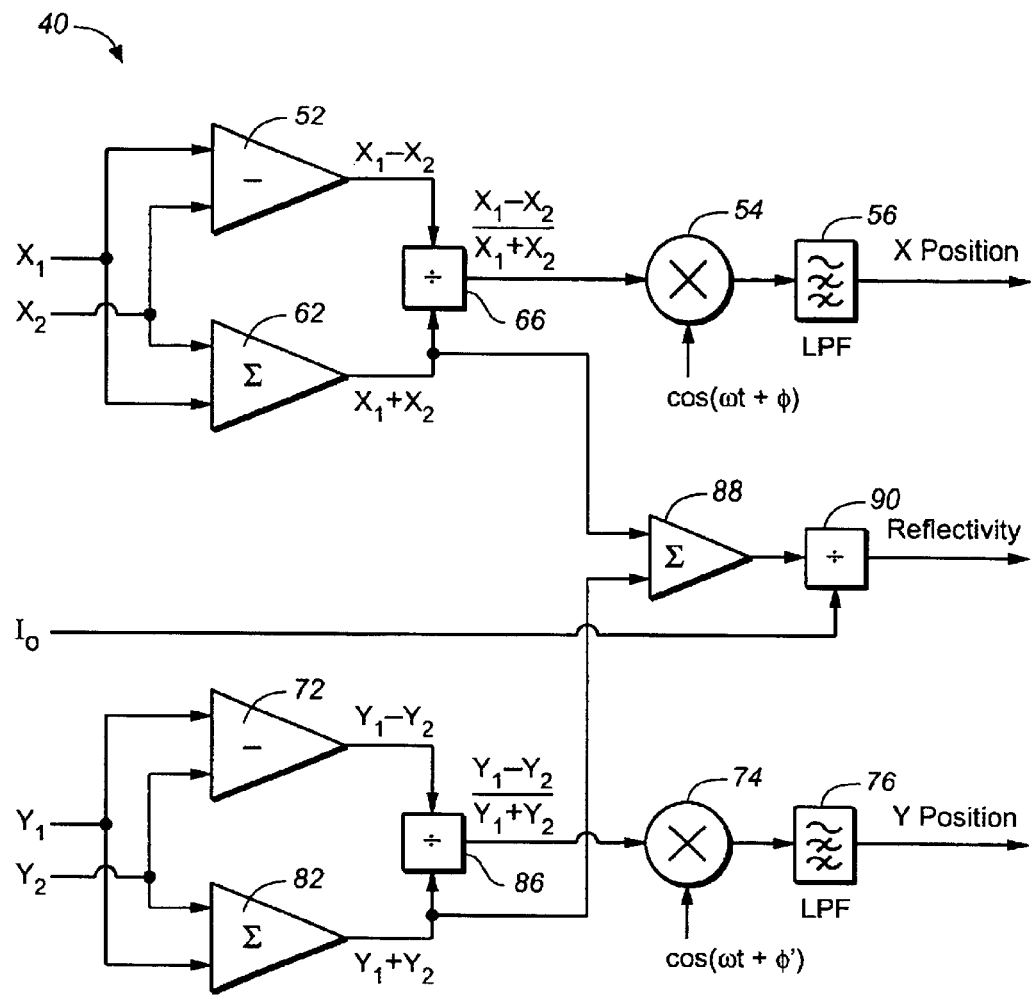
FIG._3

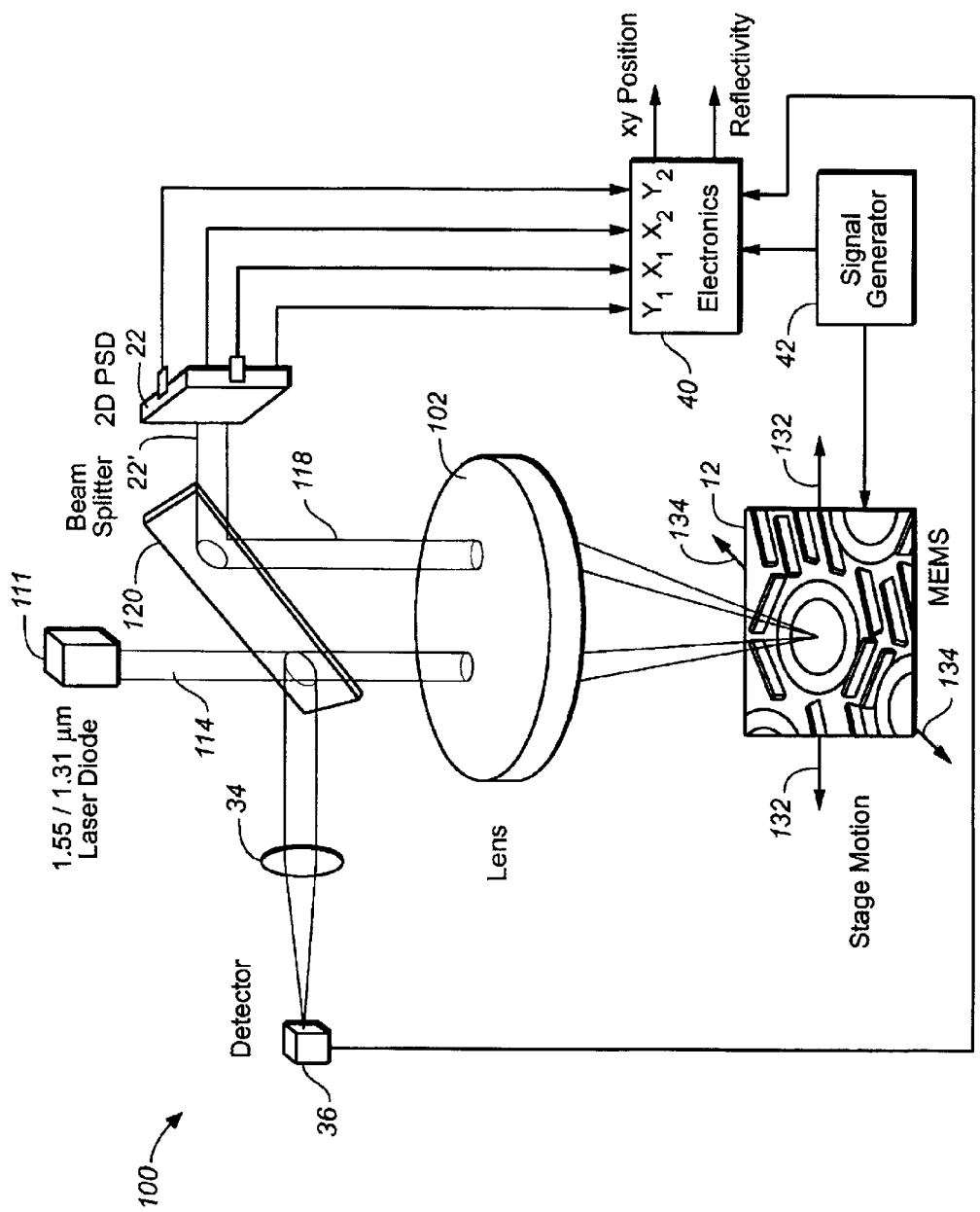
FIG._4

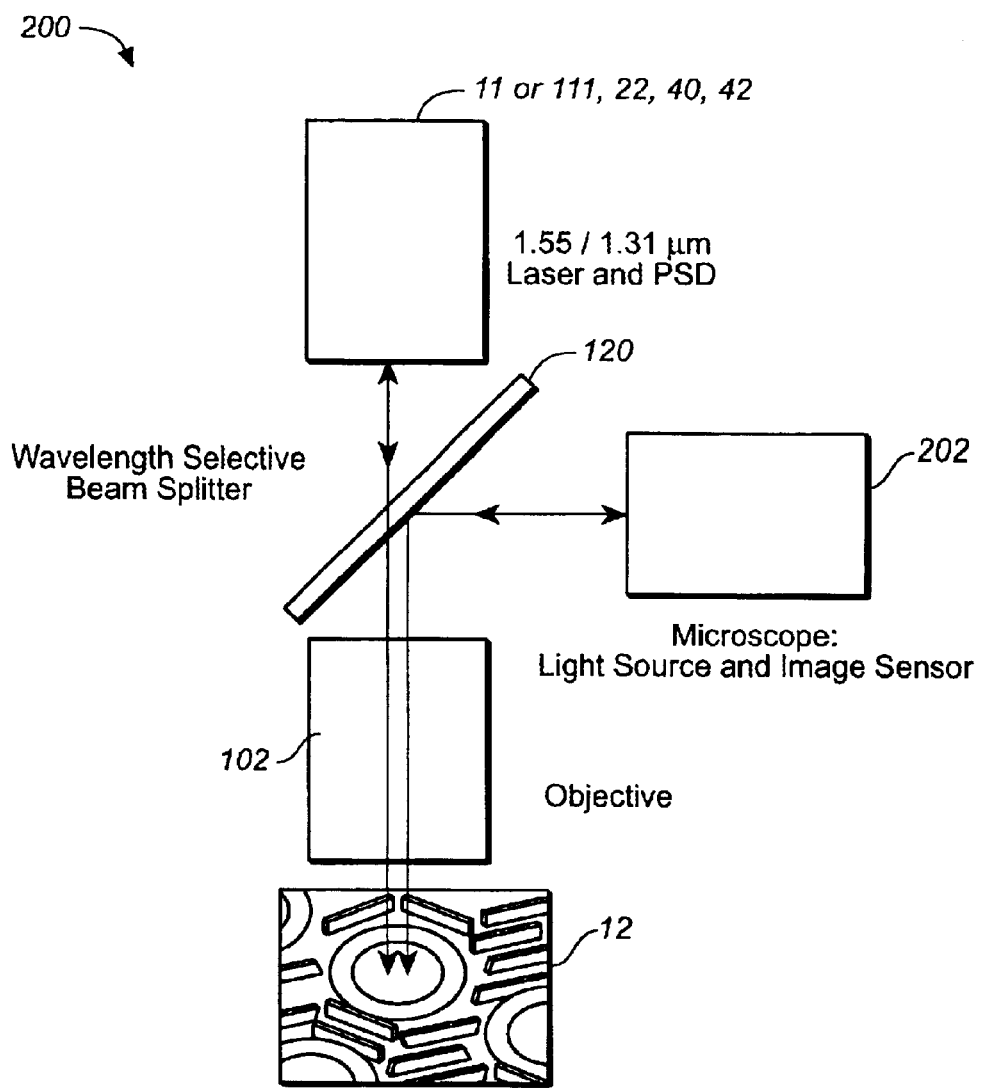
FIG._5

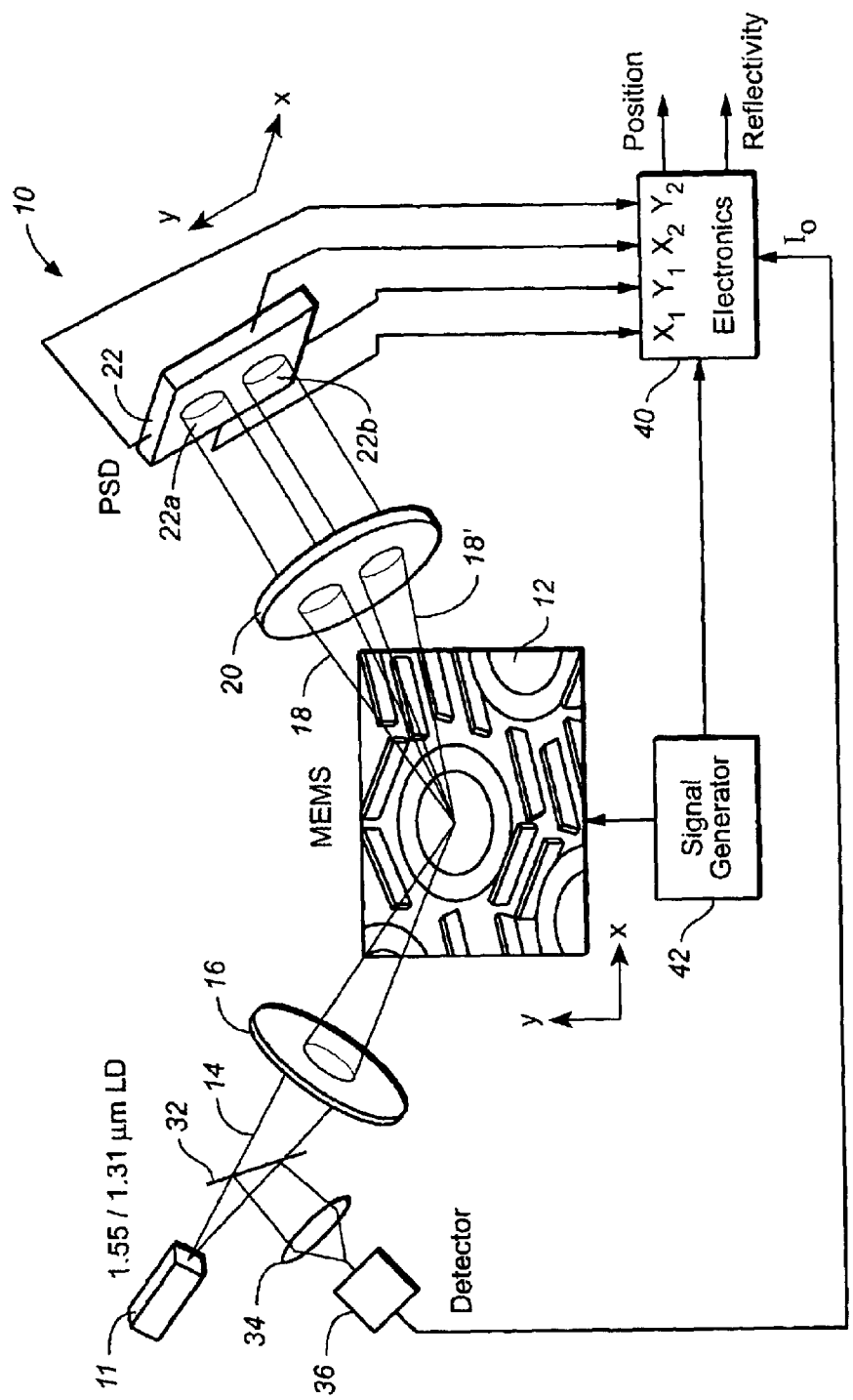
FIG._6

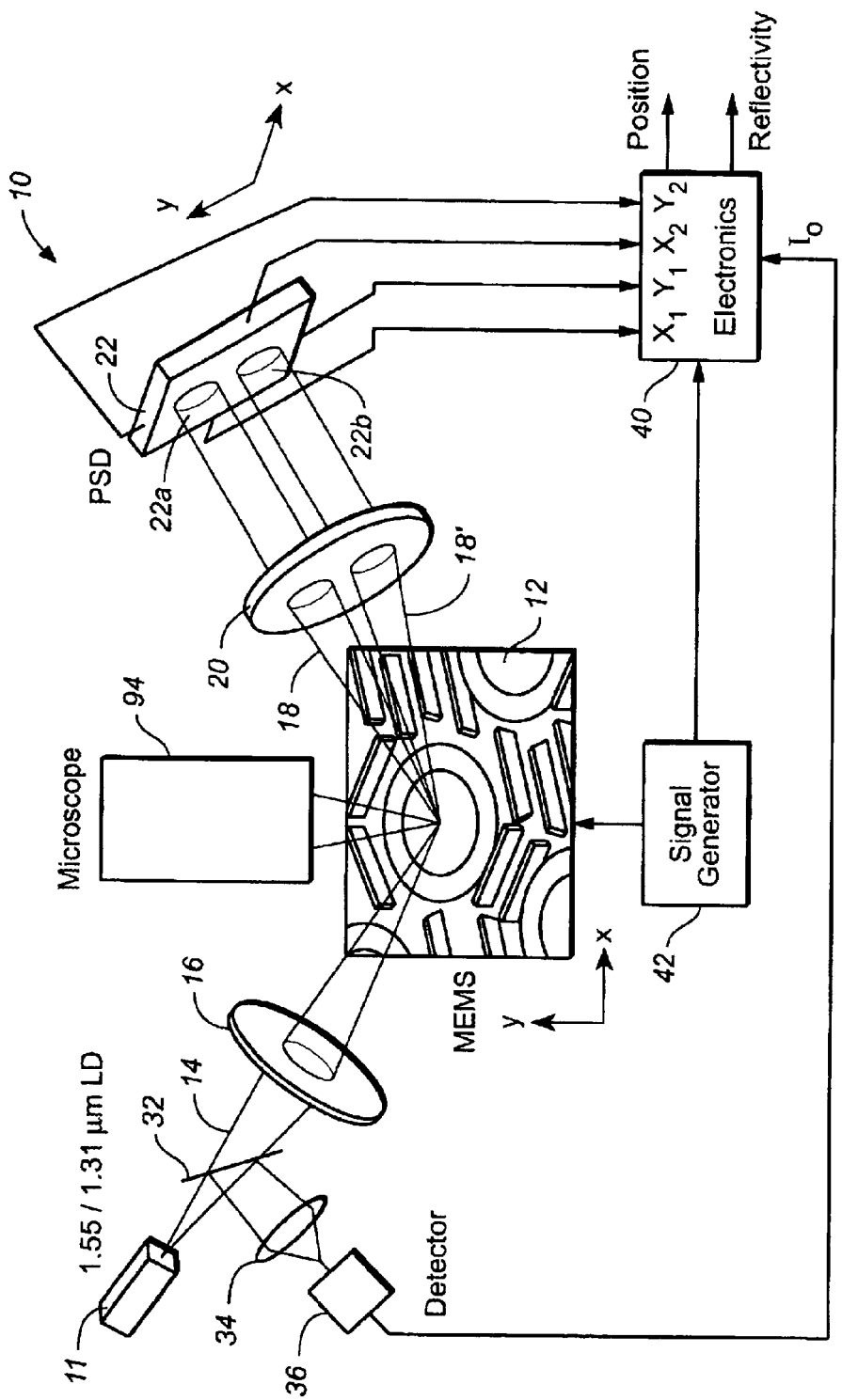
FIG._7

SYSTEM FOR MEMS INSPECTION AND CHARACTERIZATION

BACKGROUND OF THE INVENTION

This invention relates to systems for inspecting and characterizing Micro-Electro-Mechanical Systems (MEMS), especially to systems for inspecting, testing and characterizing MEMS that contain elements that move during operation.

MEMS have been in widespread use for many applications, such as accelerometers, pressure sensors and ink jet printer heads. In optical communication, MEMS are finding applications in attenuators, tunable lasers, tunable filters and optical switches. All of these applications employ members that move during operation. For MEMS used in fiberoptic communication which employs members that move during operation, it is important to be able to measure characteristics of the movable members in MEMS such as friction, stiction, stiffness, hysteresis, operating range, frequency response, deflection angle and reflectivity at wavelengths used for fiberoptic communications, such as at 1.31 and 1.55 microns. Thus, in optical switching applications, for example, while the mechanical properties of the movable members in MEMS define parameters such as speed of switching and crosstalk, the optical properties of these members such as reflectivity also affect performance of the switches since the optical properties are directly related to factors such as insertion loss.

Conventional methods for characterizing MEMS employ either vision system or interferometers. Vision systems capture the movement of MEMS through a sequence of frames and extract motional parameters from image processing algorithms applied to the captured image frames. Interferometers detect motion from optical path changes.

Vision systems are generally less sensitive and can only operate at lower bandwidth due to the limited frame rate of image sensors. Algorithms used in vision systems tend to be complicated and expensive, and the vision data obtained carries minimal useful information. To attain useful information, large amounts of data must be obtained in vision systems and processed. Interferometers, on the other hand, are most sensitive to motion. However, interferometers are generally also sensitive to environmental disturbance such as vibration and temperature variations. The tilt of optical components in MEMS during operation can be as large as 20 degrees. Therefore, the sensitivity offered by interferometers and the cost thereof may not be justified for MEMS applications. Furthermore, to this date there is no satisfactory solution for simultaneously measuring both the mechanical and optical properties of MEMS.

It is therefore desirable to provide a system for measuring MEMS where the above-described difficulties are avoided or alleviated.

SUMMARY OF THE INVENTION

This invention is based on the observation that the above objectives can be achieved by detecting the reflection of an illumination beam from a movable component in MEMS by means of a detector when the component is at different positions as a result of its movement or tilt in order to determine the characteristics of the MEMS, such as mechanical and/or optical characteristics.

When the invention is implemented in a stand-alone apparatus, the illumination beam is provided by a source directed towards the surface of a movable MEMS system component. Preferably, an external stimulus causes relative tilting between the beam and the surface about a pivot, or about one or more axes. The reflection of the illumination beam from the surface at different positions is collected by an optical collector and then detected by the detector.

Preferably, the stimulus causes the surface of the MEMS system component to oscillate at at least one frequency in order to measure the frequency response of the MEMS system component.

Preferably, the detector is a two-dimensional detector such as a position sensitive detector or a one- or two-dimensional photodetector array that measures the position of the reflected beam along one axis or two axes that are transverse to each other. Also preferably, the system can simultaneously measure the reflectivity of the MEMS system component surface and any defects thereon.

BRIEF DESCRIPTION OF THE DRAWINGS

FIG. 1 is a schematic view of a system for detecting characteristics of a MEMS system component surface that is moved during operation useful for illustrating the invention.

FIG. 2 is a partly perspective and partly schematic view of an optical system for detecting the characteristics of MEMS to illustrate one embodiment of the invention.

FIG. 3 is a schematic view of a circuit used in one or more embodiments of the invention.

FIG. 4 is a partly schematic and partly perspective view of a system for detecting the characteristics of MEMS to illustrate another embodiment of the invention.

FIG. 5 is a block diagram illustrating yet another alternative embodiment of the invention.

FIGS. 6 and 7 are partly schematic and partly perspective views of systems for detecting the characteristics of MEMS to illustrate two more embodiments of the invention.

For simplicity in description, identical components are labeled by the same numerals in this application.

DETAILED DESCRIPTION OF THE EMBODIMENTS

FIG. 1 is a schematic view of a device for inspecting and characterizing MEMS to illustrate the invention. The MEMS component has a surface 12 which reflects electromagnetic radiation, such as an optical beam. System 10 includes a source (not shown) providing a laser beam 14 that is focused onto a spot 13 on surface 12 by means of an objective such as a microscope objective 16 or a reflective element. The laser beam is reflected by surface 12 along path 18 and is collimated by a lens such as a microscope objective 20 or a reflective element into a collimated beam that is directed towards a position sensitive detector 22. Preferably, objective 20 is placed so that the spot on surface 12 illuminated by beam 14 is near or substantially at the focal point of the lens. The collimated beam from objective 20 is projected onto location 22a of detector 22. When surface 12 is tilted (such as by rotation) to a new position 12' (where the surface may be stationary or still moving), the surface reflects beam 14 along a different optical path so that the reflected beam 18' is directed towards objective 20 along the different optical path and is projected onto the detector 22 at a different location 22b.

Surface 12 may be tilted to position 12' by rotation about a pivot or an axis 11 (represented by a circle indicating that it is pointing out of the plane of the paper in FIG. 1). Alternatively, it may be tilted by simply being moved by a mechanism (not shown) so that it is at another position (not shown) with the same orientation as position 12', where the movement comprises both rotational and translational components, and where the rotational component is about pivot or axis 11. It is also possible to tilt surface 12 in the same manner about another axis in addition to the axis 11, where such another axis is normal to axis 11. This is described below in more detail with reference to FIG. 2. Such and other variations are within the scope of the invention.

By detecting the locations 22a, 22b when surface 12 is tilted, it is possible to inspect and characterize the properties of MEMS of which surface 12 is a part. From the outputs of the position sensitive detector 22, properties such as friction, sticktion, stiffness, hysteresis, operating range, frequency response, precision of deflection angle upon application of external stimulus and reflectivity can be determined. To measure stiffness, hysteresis and operating range, the surface 12 of the MEMS component is tilted by different angles, and the locations 22a and 22b are then measured. The measurement of frequency response and reflectivity (insertion loss in the case of an optical switch) is described below.

FIG. 2 is a partly schematic and partly perspective view of a system for inspecting and characterizing MEMS to illustrate one embodiment 10' of system 10 of FIG. 1. As shown in FIG. 2, a source 11, preferably a tunable source (e.g. laser), supplies beam 14'. Preferably beam 14' is in or near the normal direction to surface 12. Where system 10' is employed for MEMS used in optical communication, it is preferable for source 11 to supply radiation centered at 1.55 or 1.31 micron wavelength which are the two wavelengths normally used in optical communication. Obviously, where surface 12 is used in other types of systems, beam 14' need not be at such wavelengths; in fact, beam 14' need not be monochromatic and may contain a number of wavelengths and the various embodiments of system 10 will function essentially as described in this application for characterizing and inspecting surface 12 of MEMS. Such and other variations are within the scope of the invention.

In order to compensate for temporal variations in intensity of source 11, a portion of the radiation emitted by the source is diverted by means of a beam splitter 32 and focused by lens 34 to detector 36 whose output Io is then used for normalizing an output of detector 22 so that the effects of the intensity variations of source 11 on measurements by system 10 can be reduced or eliminated. Most of the radiation emitted by source 11 passes through the beam splitter 32 to become beam 14' as shown in FIG. 2. To simplify the figure, reflected beam 18 prior to tilting surface 12 is not shown and only the reflected beam 18' after the tilting is shown in FIG. 2. Preferably, and for reasons of compactness, the same objective 16' is used to collimate the illumination beam 14' towards surface 12 and to collect and focus the beam 18' (and beam 18 that is not shown) reflected from surface 12 to detector 22. After being focused by the objective 16', beam 18' is reflected by beam splitter 32 to the detector 22. Preferably, detector 22 is a two-dimensional position sensitive detector that is able to detect the change in position of the collected beam 18' along two axes that are transverse to each other, such as along the X and Y axes as shown in FIG. 2. Detector 22 then provides signals $X_1$ and $Y_1$ to indicate the position of spot 22a along the X and Y axes and outputs $X_2$ and $Y_2$ to indicate the position of spot 22b along the X and Y axes. These outputs are supplied to electronics block or circuit 40, which may be a hardware circuit or a computer. Block 40 takes into account the output of detector 36 for normalizing the outputs of detector 22 in order to reduce or eliminate the effects of intensity variations of source 11. By summing all of the outputs of detector 22, circuit 40 also provides an output that indicates the total intensity of beam 18', where such intensity is a measure of the reflectivity of surface 12. Circuit 40 therefore provides two outputs: positions of the reflected beams 18 and 18' and reflectivity of surface 12 and hence the insertion loss of the MEMS component.

In order to measure properties such as frequency response of MEMS of which surface 12 is a part, it is preferable to tilt surface 12 (such as by rotation) in accordance with a signal having a frequency. This signal may be generated by a signal generator 42. Thus, the signal applied by signal generator 42 may be sinusoidal signal so that surface 12 would oscillate at the frequency of the sinusoidal signal. Circuit 40 then processes the outputs of detector 22 by measuring the outputs at such frequency in order to measure MEMS frequency response. Generator 42 may also apply a signal of varying frequency, such as one that sweeps from high to low or low to high frequency, and circuit 40 detects at such varying frequency of the signal applied by generator 42. From these measurements, the mechanical response of the MEMS system of which surface 12 is a part can be measured. By measuring the reflectivity at the same time as described above, both the mechanical and optical properties of the MEMS can be measured.

FIG. 3 is a schematic circuit diagram illustrating in more detail the construction of circuit 40 of FIG. 2. As shown in FIG. 3, the difference between outputs $X_1$ and $X_2$ is computed by means of an operational amplifier 52, and the sum of outputs $X_1$ and $X_2$ is computed by means of an operational amplifier 62. The ratio between the difference and sum is computed by a divider 66, which is the X position signal which is given by:

$$X = \frac{X_1 - X_2}{X_1 + X_2}$$

When the movable MEMS component is driven by a sinusoidal signal at frequency ω, X is mainly sinusoidal plus some high order harmonics:

$$X = A_X \cos(\omega t + \phi_X) + H_X(\omega)$$

The position signal X is multiplied by the signal cos(ωt+φ) from generator 42 at multiplier 54, where φ is a phase delay that can be adjusted in a manner known to those skilled in the art, so that the output of multiplier 54 is given by:

$$X\cos(\omega t + \phi) = [A_X \cos(\omega t + \phi_X) + H_X(\omega)]\cos(\omega t + \phi)$$

$$= \frac{1}{2}A_X\cos(\phi_X - \phi) + \frac{1}{2}\cos(2\omega t + \phi_X) + H_X(\omega)\cos(\omega t + \phi)$$

The output of multiplier 54 is passed through a low pass filter 56 that passes only the DC component, which is the first term in the above equation. Both the amplitude $A_X$ and phase $\phi_X$ can be measured by varying the phase of the multiplier 54 to null or maximize the DC signal. The dynamic characteristics of frequency response about the X axis such as efficiency and delay can be obtained. It is known to those skilled in the art that $\phi_X$ and $A_X$ can be measured with a quadrature detector in which X is multiplied by cos ωt and sin ωt in two separate channels.

The difference between outputs $Y_1$ and $Y_2$ is computed by means of an operational amplifier 72, and the sum of outputs $Y_1$ and $Y_2$ is computed by means of an operational amplifier 82. The ratio between the difference and sum is computed by a divider 86, which is the Y position signal given by:

$$Y = \frac{Y_1 - Y_2}{Y_1 + Y_2}$$

When the movable MEMS component is driven by a sinusoidal signal at frequency ω, Y is mainly sinusoidal plus some high order harmonics:

$$Y = A_Y \cos(\omega t + \phi_Y) + H_Y(\omega)$$

The position signal Y is multiplied by the signal $\cos(\omega t+\phi')$ from generator 42 at multiplier 74, so that the output of multiplier 74 is given by:

$$Y\cos(\omega t + \phi') = [A_Y \cos(\omega t + \phi_Y) + H_Y(\omega)]\cos(\omega t + \phi')$$

$$= \frac{1}{2}A_Y\cos(\phi_Y - \phi') + \frac{1}{2}\cos(2\omega t + \phi_Y) + H_Y(\omega)\cos(\omega t + \phi')$$

The output of multiplier 74 is passed through a low pass filter 76 that passes only the DC component, which is the first term in the above equation. Both the amplitude $A_Y$ and phase $\phi_Y$ can be measured by varying the phase of the multiplier 74 to null or maximize the DC signal. The dynamic characteristics of frequency response about the Y axis such as efficiency and delay can be obtained. It is known to those skilled in the art that $\phi_Y$ and $A_Y$ can be measured with a quadrature detector in which X is multiplied by cos ωt and sin ωt in two separate channels.

By computing the ratios of the sum and difference of the signal components at frequency ω as described above, the effect of temporal intensity variations of the light source 11 on the X and Y position signals is thereby reduced. In the embodiment of FIG. 3, each of the filters 56, and 76 together with its corresponding multiplier 54 or 74 may be implemented as a lock-in amplifier. While preferably the detector 22 detects the mechanical characteristics of the MEMS along both the X and Y axes, it will be understood that for some applications, measurement along one axis may be adequate. In such event, detector 22 need only be a one-dimensional detector, and a transducer (not shown) used to tilt surface 12 needs to tilt it about a single axis or pivot; such and other variations are within the scope of the invention.

The outputs of amplifiers 62 and 82 are also summed by an adder 88, and the sum is divided by the output Io of detector 36 by means of divider 90 to provide an indication of the reflectivity of surface 12. By dividing the sum signal at the output of adder 88 by the output of detector 36, the effect of temporal intensity variations of source 11 on the reflectivity measurement is thereby reduced or eliminated. Instead of using hardware circuits such as those shown in FIG. 3, the above calculations and operations may also be performed by software through a computer; such and other variations are within the scope of the invention.

FIG. 4 is a partly schematic and partly perspective view of a system for inspecting and characterizing MEMS to illustrate another embodiment of the invention. As shown in FIG. 4, system 100 includes a lens 102 that focuses a collimated beam 114 from source 111 in a direction near or in the normal direction to a spot on surface 12 of a component in MEMS. Lens 102 also collects and collimates the reflection of the beam as collimated beam 118 which is reflected by a beam splitter 120 to detector 22. Instead of focusing the illumination beam to the surface 12 and collimating the reflected beam as described above and shown in FIG. 4, lens 102 may also collimate radiation from a source to direct a collimated beam to the surface and focus the collimated reflected beam to a detector. This would then be the same configuration as that shown in FIG. 2.

Similar to the configuration of FIG. 1, collimated beam 114 of FIG. 4 is focused by lens 102 to a spot on surface 12, and the reflection of the beam is collimated by lens 102 into a collimated beam 118, which is directed to the detector 22 at location 22'. Since the beam is focused to a small spot on surface 12, by moving surface 12 by means of a stage (not shown) along arrows 132, 134, it is possible to detect any bending, tilting, warping, roughness, unevenness or other deformation characteristics of the surface 12. If surface 12 is flat and smooth, one would expect the reflected beam position indicated by the location 22' to be a linear function of stage position. When the surface 12 is tilted relative to the direction of motion so that its height as seen by the beam changes with motion of the surface, the defocusing that results may be compensated for by a variety of ways, such as by moving the surface 12 up or down by means of the stage (not shown). Thus, if the vertical location 22' changes non-linearly with the stage position after the above described compensation for defocusing as surface 12 is moved by the stage along directions 132 or 134, a deformation of the surface is indicated. This is in contrast to the configuration in FIG. 2, where a collimated beam illuminates surface 12, so that the system may be less sensitive to such defects.

One difference between the setup of system 100 in FIG. 4 and system 10' in FIG. 2 is that in FIG. 4, beam 114 from source 111 is collimated and lens 102 focuses the beam to a spot on surface 12 where the spot is substantially at the focal point of lens 102. Consequentially beam 118 incident on detector 22 is collimated. In contrast, in FIG. 2, however, source 11 provides a diverging beam and is placed substantially at a focal point of lens 16', so that the beam incident on spot 13' on surface 12 is collimated. Consequently, the beam 18 (not shown) and beam 18' collected by objective 16' are also collimated. Detector 22 is placed substantially at a focal plane of objective 16' so that beams 18 and 18' are focused to spots on the detector in FIG. 2. The advantage of the configuration in FIG. 2 of system 10' is that the collected beams 18 and 18' are focused to small spots on the detector 22 so that the position measurement is more accurate in the configuration of FIG. 2. On the other hand, as shown above, the configuration of system 100 in FIG. 4 permits detection of tilt, warp or other unevenness of surface 12.

Surface 12 is that of a component in MEMS, where the component may be tilted about a pivot or about two axes transverse to each other by means of a transducer. Typically, such component with a reflective surface 12 and the transducer are both fabricated from a silicon wafer. Such type of configurations is shown, for example, in U.S. Pat. Nos. 6,300,619 and 5,345,521, and may be manufactured in a way known to those skilled in the art, such as in "Silicon Micro Machines For Lightweight Networks: Can Little Machines Make It Big?" by David Bishop, Director, Lucent Technologies, 2001 (VLSI-TSA), Taiwan, Apr. 18–20, 2001. The MEMS device available commercially are normally provided with electrical terminals. By connecting generator 42 to these terminals, the signal applied by signal generator 42 can power the transducer(s) in the MEMS device, and cause surface 12 to translate, tilt and/or oscillate about a pivot, or about one or more axes.

FIG. 5 is a schematic view of a system 200 which includes features similar to that of FIGS. 2 and 4 in characterizing MEMS of which surface 12 is a part. While all the components of FIGS. 2 and 4 are included in FIG. 5, the connections between some of them have been omitted to simplify the figure. System 200 of FIG. 5 includes also the feature where the system also detects anomalies on the surface 12. As shown in FIG. 5, system 200 includes a microscope 202 which includes a light source and image sensor. The light source in microscope 202 provides a light beam that is reflected by beam splitter 120 towards surface 12 through lens 102. The reflection of such beam through the lens is reflected by the beam splitter 120 towards the image sensor in microscope 202 for detecting any anomalies of or on the surface 12. Such anomalies can include particles on, or surface or subsurface defects in, surface 12. Microscope 94 in FIG. 7 described below has a similar construction and performs a similar function as microscope 202 in FIG. 5.

FIG. 6 is a partly schematic and partly perspective view of a system for inspecting and characterizing MEMS to illustrate in more detail one embodiment of the system 10 of FIG. 1. The operation of system 10 of FIG. 6 is substantially the same as that described above in reference to FIGS. 2–4, except that two separate optical sub-systems instead of a single sub-system are employed in FIG. 6: an illumination sub-system for providing illumination beam 14 to surface 12, and a collection sub-system for collecting the reflected beams 18 and 18' and conveying them to detector 22.

FIG. 7 is a partly schematic and partly perspective view of a system for inspecting and characterizing MEMS to illustrate another embodiment of the system 10 of FIG. 1. The embodiment of FIG. 7 is similar to that in FIG. 6, except that objective 16 collimates radiation from source 11 and provides the collimated beam to surface 12, and objective 20 collects and focuses reflected beams 18 and 18' to detector 22. Thus, the embodiment in FIG. 7 provides a more accurate measure of the mechanical and optical characteristics of the MEMS component with surface 12. In FIG. 6, since the beam is focused to a small spot on surface 12, in the same manner as that described above in reference to FIG. 4, it is possible using the system of FIG. 6 to detect any bending, tilting, warping, roughness, unevenness or other deformation characteristics of the surface 12.

Instead of using a position sensitive detector 22, other types of detectors may be used instead, such as charge coupled devices (CCDs), complementary metal-oxide-semiconductor (CMOS) devices or any other one-dimensional or two-dimensional array of individual photo detectors would serve the purpose. If such one- or two-dimensional array of detectors is used, the detector or detectors within spot 22b would provide a positive output or outputs to circuit 40. From the locations of these detectors in spot 22b and those in the location of spot 22a, circuit 40 would then compute the X and Y displacements of beam 18' from its original position at 18, from which the mechanical characteristics of MEMS can be determined in the manner described above. From the amplitude of the signals provided by the detectors in the one- or two-dimensional array within spot 22b, reflectivity of surface 12 can be measured as well. When a one- or two-dimensional array of photodiodes is used, for example, surface quality and shape of the illuminated spot on surface 12 can also be measured.

The above-described systems in FIGS. 1, 2, 4–7 are stand-alone systems. Instead of being implemented in such stand-alone systems, the concept of the invention may also be implemented as an add-on module which does not include all of the components of the stand-alone systems. For example, if the illumination and collection optics are already provided in an optical communication system, then a portion of the collected radiation in beam 18' may be diverted to position sensitive detector or a one- or two-dimensional photo detector array for detecting the displacement of the reflected beam caused by tilting of surface 12. Alternatively, if only the illumination optics is provided in an optical system, the add-on module may include the collection optics such as objective 20 and detector 22. Such and other variations are within the scope of the invention.

While the invention has been described above by reference to various embodiments, it will be understood that changes and modifications may be made without departing from the scope of the invention, which is to be defined only by the appended claims and their equivalent. All references referred to herein are incorporated by reference in their entireties.

What is claimed is:

1. An apparatus for detecting characteristics of a MEMS system component having a surface, comprising:
   a source providing an illumination beam of radiation to illuminate a spot on the surface;
   an instrument causing relative rotation by an angle between said beam and the surface about a pivot, or about at least one axis;
   an optical collector collecting a beam of radiation from the beam caused by reflection from the surface of the illumination beam; and
   a detector detecting a position of the collected radiation that results from the grotation to determine said characteristics, wherein the position of the collected radiation detected by the detector indicates the angle of the relative rotation between said beam and the surface.

2. The apparatus of claim 1, wherein said collector comprises an objective, said spot or said detector located at a focal point of said objective.

3. The apparatus of claim 2, wherein said objective comprises a lens.

4. The apparatus of claim 1, further comprising an objective that collimates or focuses the beam to illuminate the spot on the surface.

5. The apparatus of claim 1, wherein said collector comprises an objective that collimates or focuses radiation from the source to form the illumination beam and collects the reflected beam from the surface.

6. The apparatus of claim 1, further comprising a circuit processing an output of the detector to determine optical characteristics of the component.

7. The apparatus of claim 6, said instrument causing the surface to move in response to a signal, wherein said circuit processes an output of the detector according to a characteristic of the signal.

8. The apparatus of claim 7, wherein said instrument causes the surface to oscillate at at least one frequency, said circuit comprising a filter filtering the output of the detector to provide a filtered DC signal.

9. The apparatus of claim 8, wherein said instrument causes the surface to oscillate at a frequency that changes over time.

10. The apparatus of claim 8, wherein the circuit derives frequency response of the component along each of two axes transverse to each other.

11. The apparatus of claim 1, wherein said detector provides two pairs of outputs, each pair corresponding to the position of the collected beam along one of two axes transverse to each other.

12. The apparatus of claim 11, wherein said circuit derives sum and difference of each pair of signals.

13. The apparatus of claim 12, wherein said circuit derives sum of the two pairs of signals to obtain a measure of the reflectivity of said surface.

14. The apparatus of claim 13, further comprising a second detector detecting an intensity related to the intensity of the illumination beam, wherein said circuit normalizes sum of the two pairs of signals using the detected intensity from the second detector.

15. The apparatus of claim 12, wherein said circuit derives a normalized difference between the signals in each pair from said sums and differences.

16. The apparatus of claim 1, wherein said detector comprises a position sensitive detector along two axes that are transverse to each other.

17. The apparatus of claim 1, wherein the MEMS system is used in an optical device, and the radiation of said illumination beam comprises at least one wavelength component used in the device.

18. The apparatus of claim 17, wherein the at least one wavelength component has a wavelength of about 1.55 or 1.31 micron.

19. The apparatus of claim 1, further comprising a device detecting an anomaly of or on the surface.

20. The apparatus of claim 19, said device comprising a microscope.

21. The apparatus of claim 1, said illumination beam being a focused beam focused to a spot on the surface, said apparatus further comprising a stage that causes relative translational motion between the illumination beam and the surface so that the spot is scanned over the surface, wherein outputs of the detector indicate a deformation characteristic of the surface.

22. The apparatus of claim 1, said instrument causing rotational motion of the surface about a pivot, or about one or more axes.

23. An method for detecting characteristics of a MEMS system component having a surface, comprising:
    providing an illumination beam of radiation to illuminate a spot on the surface;
    causing relative rotation by an angle between said beam and the surface about a pivot, or about at least one axis;
    collecting a beam of radiation caused by reflection of the illumination beam by the surface; and
    detecting a position of the collected beam in response to the rotation and determining the angle of the relative rotation between said beam and the surface and said characteristics.

24. The method of claim 23, wherein said providing and collecting employ a common objective.

25. The method of claim 24, wherein said providing comprises collimating or focusing radiation from a source to form the illumination beam.

26. The method of claim 23, wherein said collecting comprises collimating or focusing radiation from the spot to a detector that detects position of the collected beam in response to the rotation.

27. The method of claim 23, wherein said method further comprises processing information concerning position and/or intensity of the collected beam to determine optical and/or mechanical characteristics of the component.

28. The method of claim 27, wherein said causing causes the surface to move in response to a signal, wherein said processing processes said information according to a characteristic of the signal.

29. The method of claim 28, wherein said causing causes the surface to oscillate at at least one frequency, and wherein said processing comprises filtering the information to provide a DC filtered signal.

30. The method of claim 29, wherein said causing causes the surface to oscillate at a frequency that changes over time.

31. The method of claim 29, further comprising deriving frequency responses of the component along two axes transverse to each other.

32. The method of claim 23, wherein said detecting provides two pairs of outputs, each pair corresponding to position of the collected beam along one of two axes transverse to each other.

33. The method of claim 32, further comprising deriving sum and difference of each pair of signals.

34. The method of claim 33, wherein said deriving derives sum of two pairs of signals to obtain a measure of the reflectivity of said surface.

35. The method of claim 34, further comprising detecting an intensity related to the intensity of the illumination beam, and normalizing the sum of two pairs of signals using the detected intensity.

36. The method of claim 33, wherein said deriving derives a normalized difference between the signals in each pair from said sums and differences.

37. The method of claim 23, wherein said providing provides radiation comprising at least one wavelength component that is used in the MEMS system.

38. The method of claim 37, wherein the at least one wavelength component has a wavelength of about 1.55 or 1.31 micron.

39. The method of claim 23, further comprising detecting an anomaly of or on the surface.

40. The method of claim 39, wherein said anomaly detection employs a microscope.

41. The method of claim 23, wherein said causing causes rotational motion of the surface about a pivot, or about one or more axes.

42. The method of claim 23, said illumination beam being a focused beam focused to a spot on the surface, wherein said method further comprises causing relative translational motion between the illumination beam and the surface so that the spot is scanned over the surface, and wherein said detecting provides signals that indicate a deformation characteristic of the surface.

43. An apparatus for detecting characteristics of a MEMS system component having a surface, wherein a spot on the surface is illuminated by an illumination beam of radiation, and relative rotation by an angle is caused between said beam and the surface about a pivot, or about at least one axis, said apparatus comprising:
    an optical collector collecting a beam of radiation from the beam caused by reflection from the surface of the illumination beam; and
    a detector detecting a position of the collected radiation that results from the rotation to determine said characteristics, wherein the position of the collected radiation detected by the detector indicates the angle of the relative rotation between said beam and the surfac.

44. A method for detecting characteristics of a MEMS system component having a surface, wherein a spot on the surface is illuminated by an illumination beam of radiation, and relative rotation by an angle is caused between said beam and the surface about a pivot, or about at least one axis, said method comprising:
    collecting a beam of radiation from the beam caused by reflection from the surface of the illumination beam; and
    detecting a position of the collected radiation that results from the rotation and determining the angle of the relative rotation between said beam and the surface and said characteristics.

45. An apparatus for detecting deflection angle of a MEMS system component having a surface, comprising:

a source providing an illumination beam of radiation to illuminate a spot on the surface, wherein a reflection of the beam from the surface is caused by a stimulus to be deflected by an angle;

an optical collector collecting a beam of radiation from the beam caused by reflection from the surface of the illumination beam; and a detector detecting a position of the collected radiation that results from the rotation, wherein the position of the collected radiation detected by the detector indicates precision of the deflection angle of said beam from the surface.

46. The apparatus of claim 45, wherein said detector also detects reflectivity of the surface.

47. The apparatus of claim 45, wherein the MEMS system is used in an optical device, and the radiation of said illumination beam comprises at least one wavelength component used in the device.

48. The apparatus of claim 47, wherein the at least one wavelength component has a wavelength of about 1.55 or 1.31 micron.

49. The apparatus of claim 45, wherein said detector also detects frequency response of the rotation.

50. A method for detecting deflection angle of a MEMS system component having a surface, comprising:

providing an illumination beam of radiation to illuminate a spot on the surface, wherein a reflection of the beam from the surface is caused by a stimulus to be deflected by an angle;

collecting a beam of radiation from the beam caused by reflection from the surface of the illumination beam; and detecting a position of the collected radiation that results from the rotation, wherein the position of the collected radiation detected by the detector indicates precision of the deflection angle of said beam from the surface.

51. The method of claim 50, wherein the detecting also detects reflectivity of the surface.

52. The method of claim 50, wherein the MEMS system is used in an optical device, and the radiation of said illumination beam comprises at least one wavelength component used in the device.

53. The method of claim 52, wherein the at least one wavelength component has a wavelength of about 1.55 or 1.31 micron.

54. The method of claim 50, wherein said detecting also detects frequency response of the rotation.

* * * * *